United States Patent [19]

Banks et al.

[11] Patent Number: 4,499,162

[45] Date of Patent: Feb. 12, 1985

[54] PHOTOMASK AND METHOD OF USING SAME

[75] Inventors: Edward L. Banks, Whitehall Township, Lehigh County; Thomas S. Ellington, IV, Upper Milford Township, Lehigh County, both of Pa.; Birol Küyel, Hopewell Township, Mercer County, N.J.

[73] Assignee: AT&T Technologies, Inc., New York, N.Y.

[21] Appl. No.: 507,371

[22] Filed: Jun. 24, 1983

[51] Int. Cl.³ .............................. G03F 9/00; G03C 5/06
[52] U.S. Cl. ......................................... 430/5; 430/396;
428/203; 428/209; 427/164; 427/165
[58] Field of Search ..................... 428/203, 209; 430/5, 430/396; 427/164, 165

[56] References Cited
U.S. PATENT DOCUMENTS 4,063,812 12/1977 Abraham et al. ...................... 355/18
4,178,404 12/1979 Allen et al. ........................... 428/209
4,361,643 11/1982 Banks et al. .......................... 430/396
4,390,273 6/1983 Loebach et al. ...................... 355/125

FOREIGN PATENT DOCUMENTS 53-94770 8/1978 Japan ........................................ 430/5
55-115042 9/1980 Japan ........................................ 430/5
2036367 6/1980 United Kingdom .

Primary Examiner—John E. Kittle
Assistant Examiner—José G. Dees
Attorney, Agent, or Firm—D. J. Kirk; R. B. Levy

[57] ABSTRACT

A photomask (60) used to form patterns on a resist coated semiconductor wafer is comprised of a light transmissive baseplate (62) having a thin metallic pattern (63) thereon; a plasma deposited coating (66) covering the patterned baseplate (62); a light transmissive, planar coverplate (68) in intimate contact with the coating (66) with an index matching fluid (72) interposed therebetween.

10 Claims, 4 Drawing Figures

– –

PHOTOMASK AND METHOD OF USING SAME

TECHNICAL FIELD

The instant invention relates to semiconductor circuit photomasks. In particular, the invention is directed to photomasks and techniques for using such photomasks in projection printing.

BACKGROUND OF THE INVENTION

Photomasks having a metallized pattern on a light transmissive substrate are well known for their use in projection printing associated with the fabrication of semiconductor devices. The pattern on such a photomask has a high resolution metallic pattern with feature sizes rapidly approaching the 1 $\mu$m to 2 $\mu$m range. The quality of the metallized pattern is very critical to the semiconductor manufacturing process, and the photomasks are therefore carefully fabricated substantially free from any defects. Maintaining the photomasks in this defect free state is essential if acceptable device yields are to be achieved. In addition to particulate contamination, the various cleaning and handling operations that the photomask is subjected to can cause a slow deterioration of the pattern. When such defects are multiplied by the six or more masks in a set required to fabricate a semiconductor device the yield loss can become significant.

One approach to protecting the metallic photomask pattern from physical damage is described in U.S. Pat. No. 4,361,643 entitled "A Photomask and Method of Using Same" which issued to Banks et al. on Nov. 30, 1982 and is assigned to the instant assignee and is incorporated by reference herein. Banks et al. describe a technique whereby a planar, transparent coverplate is placed in intimate contact with the patterned surface of a transparent baseplate with an index matching material, having substantially the same index as both the coverplate and the baseplate, interposed therebetween. Such a mask not only protects the patterned substrate but dust or other particles depositing on the coverplate will be offset from the plane of the pattern and will not be focused on the photoresist coated substrate.

The Banks et al. technique has been found to be most effective. However, particles may become entrapped between the coverplate and the mask during the fabrication process. The only way these defects can be identified is to make actual prints with the same mask before and after the application of the coverplate thereon. Since unprotected masks can be damaged during such pre-protection runs the coverplate has been assembled thereto without obtaining prints prior to such assembly. Thus, undesirably, it is not known whether the integrity of the mask is compromised during the application of the coverplate.

Once such an uninspected mask is used in production and defects are noted the coverplate can be removed, the mask cleaned and the coverplate reapplied. However, such removal of the coverplate and cleaning of the viscous index matching fluid from the mask surface provides the potential to damage the metallic portion of the mask.

Accordingly, there is a need for a mask protection technique that provides particle offset associated with the coverplate along with mechanical protection during repair and reassembly while maintaining inspectability to qualify the mask for use.

SUMMARY OF THE INVENTION

The instant invention overcomes the foregoing problems with a photomask comprised of a light transmissive baseplate having a metallic pattern thereon; a light transmissive coating covering the metallic patterned surface; and a light transmissive coverplate, having opposed, substantially parallel surfaces positioned on the light transmissive coating with an index matching fluid interposed therebetween.

DETAILED DESCRIPTION

Figure 1:
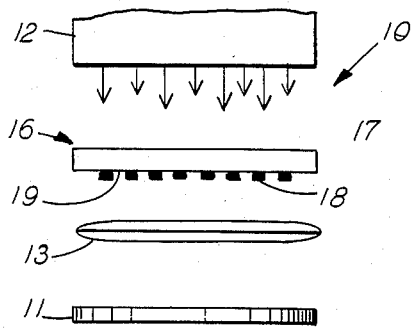
FIG. 1 is a schematic view representing a prior art projection printing system.

During the fabrication of semiconductor devices or the like, a light projection system, generally indicated by the numeral 10 in FIG. 1 has been used. A semiconductor wafer 11 having a resist coating (not shown) is vertically aligned with an ultraviolet source 12 and focusing optics 13. Such a projection system 10 is manufactured by the Perkin-Elmer Company, as their Microline Model No. 240.

In operation, a photomask 16 is interposed between the ultraviolet source 12 and the focusing optics 13. The photomask 16 is comprised of a transparent substrate 17, such as fused silica, with a metallic (e.g., chromium) pattern 18 thereon. The ultraviolet radiation from the source 12 passes through the unmetallized areas 19 on the photomask 16 and is focused by the optics 13 onto the resist coating on the semiconductor wafer 11 to expose and insolubilize (i.e., when using a negative acting resist) the coating. A suitable solvent is then employed to wash away the soluble resist coating in order that the exposed areas be further processed.

Such a procedure is usually repeated a number of times using a plurality of photomasks 16 having different patterns 18 thereon to fabricate the desired device. Although the metallic pattern 18 does not contact the resist coated wafer 11, various cleaning and other handling operations result in deterioration of the pattern.

Figure 2:
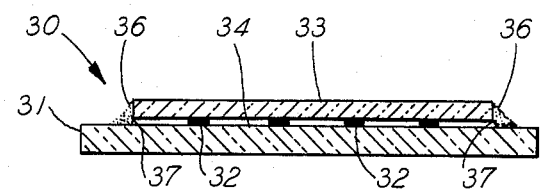
FIG. 2 is a cross-sectional view of a prior art photomask.

A photomask 30 (see FIG. 2) described in the above-referred to Banks et al. patent is comprised of a transparent baseplate 31 having a metallic pattern 32 thereon and a substantially flat, transparent, coverplate 33 placed over the patterned baseplate. Additionally, an index matching fluid 34 fills in the unmetallized volume between the baseplate 31 and the coverplate 33 to substantially eliminate interference fringes produced by light reflecting from the two surfaces in near contact. Bonding material 36 at the interface edge 37 between the baseplate 31 and the coverplate 33 holds the coverplate in place on the baseplate while sealing the index matching fluid 34 therebetween. As hereinbefore indicated, the photomask 30 of FIG. 2 has been found to be most effective but cannot be readily inspected or repaired.

Figure 3:
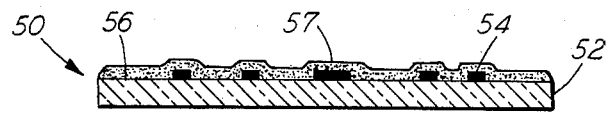
FIG. 3 is a cross-sectional view of the instant mask.

Another mask 50, shown in FIG. 3 and described in U.S. patent application Ser. No. 488,315, filed on Apr. 25, 1983, assigned to the instant assignee which is incorporated by reference herein also provides protection for the patterned substrate. The mask 50 is comprised of a light transmissive baseplate 52 having a metallic pattern 54 thereon. A light transmissive plasma deposited resistive coating 56 covers the baseplate 52 and the pattern 54 thereon. The coating material 56 is substantially the same material as the substrate 52. Accordingly, both the coating 56 and the substrate 52 have substantially the same index of refraction (approximately 1.5) which effectively eliminates the interface therebetween and any undesirable refraction or reflections at such an interface.

Advantageously, such a conformal, plasma deposited, coating 56 on the patterned substrate 52 has been found effective in protecting the mask 50 during use, handling and cleaning. Furthermore, when the coating 56 is a dielectric material such as plasma deposited $SiO_2$, having very high threshold breakdown field strengths (250,000 volts/cm compared to approximately 20,000 volts/cm in air), any electrical discharge between portions of the metallized pattern is substantially suppressed. Such suppression eliminates undesirable ablating of portions of the metallized pattern caused by such electrical discharge.

Although many dielectric and glass films may have very high electrical breakdown threshold field strengths they do not provide adequate static protection since they also have extremely high (substantially infinite) resistivity. Unfortunately, such films can be readily charged and such charge will decay slowly. Accordingly, a pure dielectric film can charge to very high voltages during high pressure deionized water cleaning of the mask. Also a pure dielectric would not prevent the metallized pattern on the mask from charging during UV exposure.

Additionally, a static charge on the coated mask will attract particles which will register as defects. However, it has been discovered that if the coating is plasma deposited $SiO_2$ it will not charge and will attract substantially no particles. Furthermore, any particle depositing on the uncharged surface can be much more readily removed therefrom than from a charged surface. However, such a coating 56 does not cause any dust or dirt which may deposit thereon to be brought out of focus.

Figure 4:
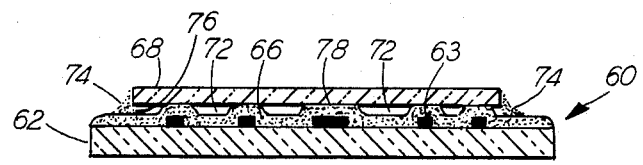
FIG. 4 is a cross-sectional view of the instant mask.

The instant mask 60, which overcomes the foregoing problems, as shown in FIG. 4 is comprised of a baseplate 62 with a metallized pattern 63 thereon, a plasma deposited conformal coating 66 and a coverplate 68 placed on the coating 66 with an index matching fluid 72 captured therebetween. Bonding material 74 located at an interface edge 76 between the baseplate 31 and the coverplate 68 holds the coverplate in place while sealing the index matching fluid 72 therein.

In an exemplary embodiment the baseplate 62 is a fused silica with a chromium pattern 63 thereon. The coating 66 is a plasma deposited $SiO_2$ approximately 1.0 $\mu m$ in thickness and having a threshold breakdown field strength of 250,000 volts/cm and a resistivity of $1.5 \times 10^{11}$ ohm-cm. Such resistivity is sufficiently low that neither the coating nor the metallized pattern can maintain a charge (charge relaxation time is 29 milliseconds) when the coating is in contact with a grounded mask holder (not shown). If desired, the resistivity of the $SiO_2$ coating 66 can be altered by controlling the $H_2$ content of the coating or doping the coating with metallic ions. The coverplate 68 is also fused silica and the index matching material 72 has an index of refraction which is substantially the same as the baseplate 62, the coating 66 and the coverplate 68. The index matching material 72 is comprised of an aliphatic hydrocarbon hydrogenated terphenyl, type AA phthalate ester manufactured by P. P. Cargille Laboratories, Inc.

Advantageously, the patterned substrate 62, with the protective coating 66 thereon, can be inspected for qualification prior to placing the coverplate 68 thereon. After inspection an actual printing can be accomplished as a record to be compared against a later printing with the coverglass 68 in place to determine the defect contribution, if any, of the coverplate application process.

Accordingly, masks having coverplates 68 thereon can be qualified. Additionally, if defects are found, the coverplate 68 can readily be removed or replaced and the index matching fluid 72 cleaned from the patterned substrate 62 having the protective coating 66 thereon without causing damage to the metallized pattern. Thus, the protective $SiO_2$ coating 66 used in conjunction with the coverplate 68 provides mechanical protection while providing particle offset in a mask 60 that is qualifiable and removable.

Further, the antistatic property of the plasma deposited $SiO_2$ coating, when grounded, prevents charge accumulation on the surface 78, of the coated substrate 62 during the application of the coverplate 68. Since the mechanism of particle collection in a clean room is believed to be electrostatic, the $SiO_2$ coated and grounded masks will remain cleaner than uncoated masks during the period of the application of the coverplate 68.

It is to be understood that the embodiments described herein are merely illustrative of the invention. Various modifications may be made thereto by persons skilled in the art which embody the principles of the invention and fall within the spirit and scope thereof.

What is claimed is:

1. A photomask comprising:
a light transmissive baseplate having a metallic pattern thereon;
a light transmissive coating covering the metallic patterned surface; and
a light transmissive coverplate having opposed, substantially parallel surfaces positioned on the light transmissive coating with an index matching fluid interposed therebetween.

2. The photomask as set forth in claim 1, wherein:
the light transmissive coating is electrically resistive.

3. The photomask as set forth in claim 2, wherein:
the baseplate, the electrically resistive coating, the coverplate, and the index matching fluid have substantially the same index of refraction.

4. The photomask as set forth in claim 2, wherein:
the electrically resistive layer is plasma deposited.

5. The photomask as set forth in claim 2, wherein:
the electrically resistive layer is a conformal plasma deposited $SiO_2$ coating.

6. A method of selectively exposing a photoresist coated substrate to light radiation, comprising the steps of:
positioning a photomask between a light source and a photoresist coated substrate, the photomask comprising:
(a) a light transmissive baseplate having a metallic pattern thereon;
(b) a light transmissive coating covering the metallic patterned surface;
(c) a light transmissive coverplate, having opposed, substantially parallel surfaces, positioned on the light transmissive coating with an index matching fluid interposed therebetween; and activating the light source to direct the light radiation through the photomask to selectively expose the photoresist coated substrate thereto.

7. The method as set forth in claim 6, wherein:
the light transmissive coating is electrically resistive.

8. The method as set forth in claim 7, wherein:
the electrically resistive coating is plasma deposited.

9. The photomask as set forth in claim 7, wherein:
the electrically resistive layer is a conformal plasma deposited $SiO_2$ coating.

10. A method of fabricating a photomask comprising the steps of:

applying a metallic pattern to a transparent baseplate;

applying a light transmissive coating to the metallic pattern, the light transmissive coating having approximately the same index of refraction as that of the transparent baseplate;

inspecting the metallic pattern on the transparent baseplate to determine if any defect occurred during application of the light transmissive coating thereto;

removably positioning a light transmissive coverplate on the light transmissive coating;

sealing an index matching fluid between the coverplate and the light transmissive coating; and reinspecting the metallic pattern to determine if any defect occurred as a consequence of removably positioning the light transmissive coverplate on the light transmissive coating.

* * * * *